US010842015B2

(12) United States Patent
Kita

(10) Patent No.: US 10,842,015 B2
(45) Date of Patent: Nov. 17, 2020

(54) CONDUCTIVE MEMBER, CIRCUIT ASSEMBLY, AND METHOD FOR MANUFACTURING CONDUCTIVE MEMBER

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventor: Yukinori Kita, Mie (JP)

(73) Assignees: AutoNetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/327,143

(22) PCT Filed: Aug. 21, 2017

(86) PCT No.: PCT/JP2017/029720
§ 371 (c)(1),
(2) Date: Feb. 21, 2019

(87) PCT Pub. No.: WO2018/038030
PCT Pub. Date: Mar. 1, 2018

(65) Prior Publication Data
US 2019/0208617 A1    Jul. 4, 2019

(30) Foreign Application Priority Data

Aug. 22, 2016   (JP) .................................. 2016-161934

(51) Int. Cl.
*H05K 1/02*        (2006.01)
*H05K 1/18*        (2006.01)
(Continued)

(52) U.S. Cl.
CPC ........... *H05K 1/0204* (2013.01); *H05K 1/181* (2013.01); *H05K 3/0058* (2013.01);
(Continued)

(58) Field of Classification Search
CPC .. H05K 1/02; H05K 1/18; H05K 3/16; H05K 3/26; H05K 7/06; B32B 15/04
(Continued)

(56) References Cited

U.S. PATENT DOCUMENTS 4,369,422 A * 1/1983 Rasmussen .......... H01H 85/143
  337/248
4,375,630 A * 3/1983 Gaia ...................... H01H 85/47
  337/248
(Continued)

FOREIGN PATENT DOCUMENTS

| JP | S61-015592 U | 1/1986 |
| JP | H5-025764 U | 2/1993 |

OTHER PUBLICATIONS

International Search Report, Application No. PCT/JP2017/029720, dated Oct. 24, 2017.

*Primary Examiner* — Xiaoliang Chen
(74) *Attorney, Agent, or Firm* — Honigman LLP

(57) ABSTRACT

Provided is a conductive member including a busbar having a through hole, and a metal member fixed to the busbar, the metal member including a shaft portion passed through the through hole, and a first head portion at one end portion of the shaft portion, the first head portion having an outer diameter larger than the diameter of the through hole. Since the metal member includes the first head portion, it is possible to increase the heat capacity of the metal member as compared with that achieved with a conventional conductive member that does not include the first head portion. Accordingly, it is possible to further increase the heat
(Continued)

dissipation of the conductive member using a simple configuration.

11 Claims, 9 Drawing Sheets

(51) Int. Cl.
  *H05K 3/16* (2006.01)
  *H05K 3/26* (2006.01)
  *H05K 7/06* (2006.01)
  *B32B 15/04* (2006.01)
  *H05K 3/00* (2006.01)

(52) U.S. Cl.
  CPC ............. *H05K 2201/10166* (2013.01); *H05K 2201/10272* (2013.01); *H05K 2201/10416* (2013.01)

(58) Field of Classification Search
  USPC ...... 361/704, 679.01; 428/139, 457; 438/39, 438/110
  See application file for complete search history.

(56) References Cited

U.S. PATENT DOCUMENTS

| | | | | |
|---|---|---|---|---|
| 5,294,223 | A | * | 3/1994 | Phillips, II ............ F16B 37/067 411/113 |
| 5,342,204 | A | * | 8/1994 | Och ........................ F21V 21/08 439/39 |
| 5,397,238 | A | * | 3/1995 | Och ........................ F21V 21/08 439/39 |
| 6,131,798 | A | * | 10/2000 | Prengaman ................ C25C 7/02 228/139 |
| 2008/0123261 | A1 | * | 5/2008 | Maegawa ........... B29C 45/1671 361/679.01 |
| 2010/0124665 | A1 | * | 5/2010 | Maegawa ............... H05K 3/325 428/457 |
| 2017/0003349 | A1 | * | 1/2017 | Dawley ............... H01M 10/482 |
| 2018/0019646 | A1 | * | 1/2018 | Quick ..................... H02K 11/33 |
| 2018/0326924 | A1 | * | 11/2018 | Haraguchi ............... H05K 7/06 |

* cited by examiner

CONDUCTIVE MEMBER, CIRCUIT ASSEMBLY, AND METHOD FOR MANUFACTURING CONDUCTIVE MEMBER

CROSS-REFERENCE TO RELATED APPLICATIONS

This application is the U.S. national stage of PCT/JP2017/029720 filed Aug. 21, 2017, which claims priority of Japanese Patent Application No. JP 2016-161934 filed Aug. 22, 2016.

TECHNICAL FIELD

The technique disclosed in the present specification relates to a conductive member, a circuit assembly, and a method for manufacturing the conductive member.

BACKGROUND

Conventionally, conductive members including a metal member fixed to a busbar are known (e.g., see JP 2015-47031A). Specifically, the circuit assembly described in JP 2015-47031A has a through hole formed in the busbar, and is configured to dissipate the heat of the circuit assembly with a simple configuration by press-fitting an inlaid component (corresponding to the metal member) into the through hole.

However, there is still room to improve the circuit assembly described in JP 2015-47031A in terms of increasing the heat dissipation thereof.

The present specification discloses a technique for further increasing the heat dissipation of the circuit assembly using a simple configuration.

SUMMARY

A conductive member disclosed in the present specification is a conductive member including: a busbar having a through hole; and a metal member fixed to the busbar, wherein the metal member includes a shaft portion passed through the through hole, and a first head portion at one end portion of the shaft portion, the first head portion having an outer diameter larger than a diameter of the through hole.

With the above-described conductive member, the metal member includes the first head portion, and it is thus possible to increase the heat capacity of the metal member as compared with that achieved with a conventional metal member that does not have the first head portion. Accordingly, it is possible to further increase the heat dissipation of the conductive member using a simple configuration.

The busbar may be formed of a copper alloy, and the metal member may be formed of pure copper.

For example, the thermal conductivity and the electrical conductivity can also be increased by forming the busbar with pure copper. However, there is concern that the leakage characteristics may be degraded as compared with the use of a copper alloy. With the above-described conductive member, the busbar is formed with a copper alloy, whereas the metal member is formed with pure copper. Accordingly, it is possible to suppress the degradation of leakage characteristics, while increasing the thermal conductivity and the electrical conductivity.

A second head portion having an outer diameter larger than the diameter of the through hole may be provided at another end portion of the shaft portion.

With the above-described conductive member, the metal member can be firmly fixed to the busbar.

The busbar may have a first surface coming into contact with the first head portion, and a second surface located opposite to the first surface, and a countersunk hole having a diameter larger than the diameter of the through hole may be provided in the second surface of the busbar around an edge portion of the through hole, and the second head portion may be accommodated in the countersunk hole.

With the above-described conductive member, the distal end face of the second head portion of the metal member can be made substantially flush with the second surface of the busbar. Accordingly, the distal end face of the second head portion and the second surface of the busbar can together be brought into surface contact with the flat surface of the heat sink. Consequently, it is possible to further increase the heat dissipation of the conductive member.

The busbar may have a first surface coming into contact with the first head portion, and a second surface located opposite to the first surface, and a protrusion formed on the first surface and a recess formed in the second surface at a position corresponding to the protrusion may form a stepped portion on the busbar, and the first head portion may be accommodated in the recess.

With the above-described conductive member, the distal end face of the first head portion of the metal member can be made substantially flush with the first surface of the busbar. Accordingly, the distal end face of the first head portion and the first surface of the busbar can together be brought into surface contact with the flat surface of the heat sink. By doing so, the contact area between the metal member and the heat sink can be increased as compared with a case where the distal end face of the shaft portion is brought into surface contact with the heat sink, thus making it possible to further increase the heat dissipation of the conductive member.

A circuit assembly disclosed in the present specification includes: the conductive member according to any one of claims 1 to 4; and a circuit board having an opening in which the first head portion is to be accommodated, wherein the busbar is overlapped with and bonded to the circuit board in a state in which the first head portion is accommodated in the opening.

With the above-described circuit assembly, it is possible to further increase the heat dissipation of the circuit assembly using a simple configuration.

A circuit assembly disclosed in the present specification includes: the conductive member according to claim 5; and a circuit board having an opening in which the protrusion is to be accommodated, wherein the busbar is overlapped with and bonded to the circuit board in a state in which the protrusion is accommodated in the opening.

With the above-described circuit assembly, it is possible to further increase the heat dissipation of the circuit assembly using a simple configuration.

A terminal of an electronic component may be connected to the metal member.

With the above-described circuit assembly, it is possible to dissipate the heat of the electronic component using the metal member.

A method for manufacturing a conductive member disclosed in the present specification includes a busbar having a through hole, and a metal rivet including a shaft portion and a first head portion formed at one end portion of the shaft portion, the first head portion having an outer diameter larger than a diameter of the through hole, the method including the steps of inserting the shaft portion into the through hole; and fixing another end portion of the shaft portion to the busbar through crimping.

With the above-described manufacturing method, it is possible to fix the metal member to the busbar, while further increasing the heat dissipation of the conductive member using a simple configuration.

A method for manufacturing a conductive member disclosed in the present specification includes a busbar having a through hole, and a metal rivet including a shaft portion and a first head portion formed at one end portion of the shaft portion, the first head portion having an outer diameter larger than a diameter of the through hole, the method including the step of: press-fitting the shaft portion into the through hole.

With the above-described manufacturing method, it is possible to fix the metal member to the busbar, while further increasing the heat dissipation of the conductive member using a simple configuration.

Advantageous Effects of Disclosure

According to the technique disclosed in the present specification, it is possible to further increase the heat dissipation of a conductive member using a simple configuration.

DETAILED DESCRIPTION OF PREFERRED EMBODIMENTS

Embodiment 1

Embodiment 1 will be described with reference to FIGS. 1 to 6. The following description will be given, assuming that the Z direction is upward, the Y direction is forward, and the X direction is right.

Circuit Assembly

Figure 1:
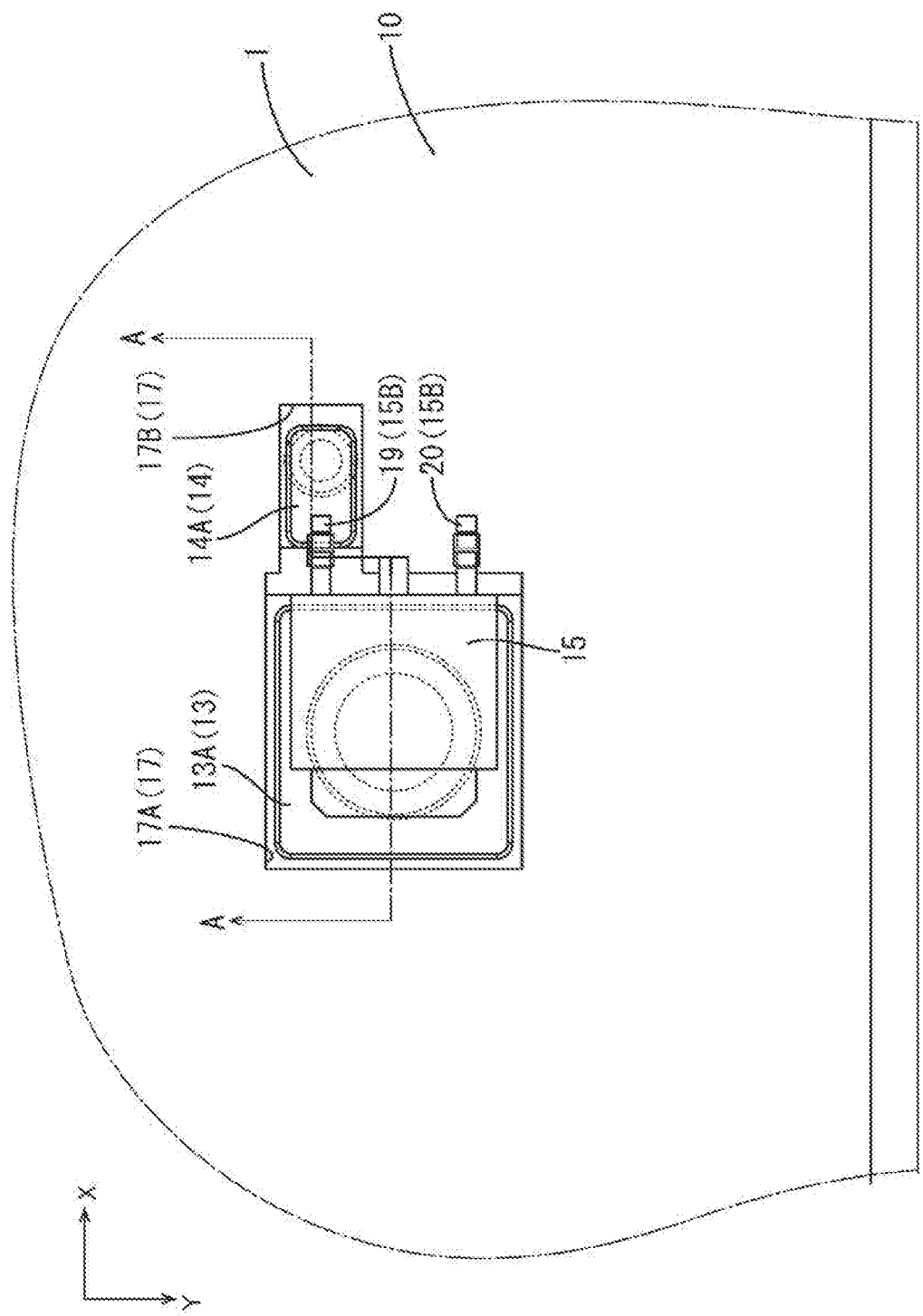
FIG. 1 is a top view of a portion of a circuit assembly according to Embodiment 1.
Figure 2:
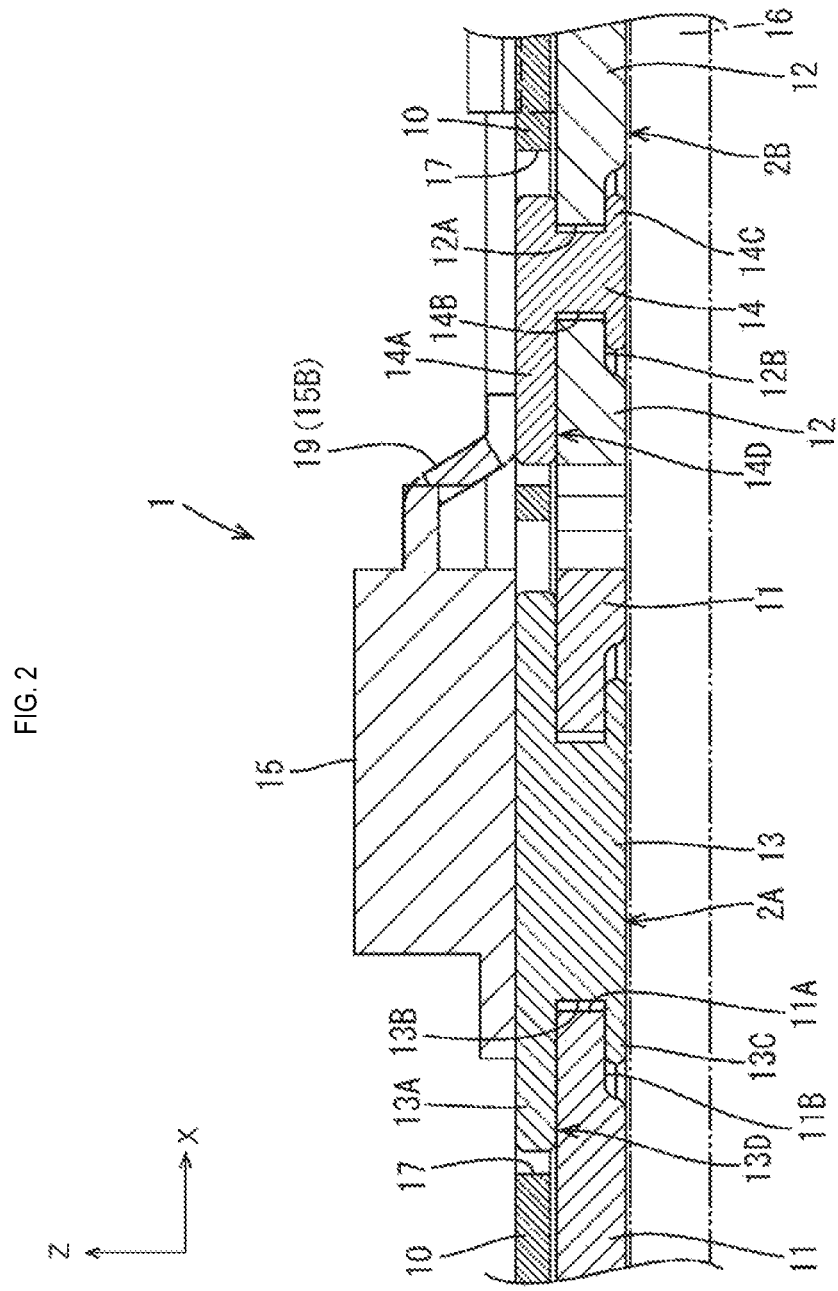
FIG. 2 is a cross-sectional view taken along the line A-A shown in FIG. 1.

As shown in FIGS. 1 and 2, a circuit assembly 1 includes a circuit board 10 (FIGS. 1, 2), a plurality of (two in the present embodiment) conductive members 2A and 2B (FIG. 2) that are overlapped with the circuit board 10, an electronic component 15 (FIGS. 1, 2) implemented on the upper surface of the circuit board 10, an insulating heat dissipation sheet (not shown), a heat sink 16 (FIG. 2), and so forth.

Figure 3:
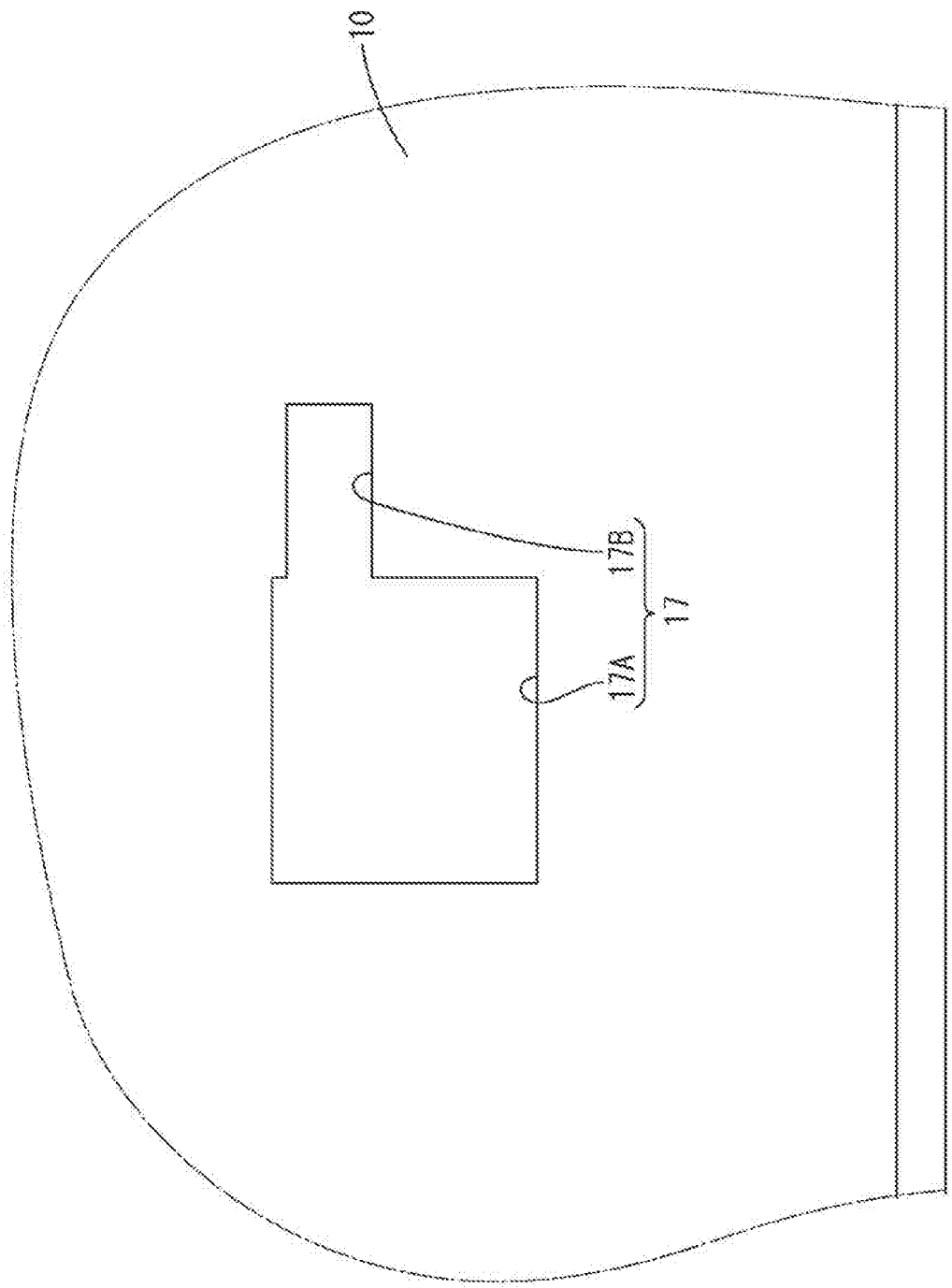
FIG. 3 is a top view of a portion of a circuit board.

The circuit board 10 is a plate-shaped printed circuit board formed by printing a conductive path (not shown) made of a conductive material such as a copper foil or the like on the upper surface of an insulating plate made of an insulating material. As shown in FIG. 3, an opening 17 in which first head portions 13A and 14A (FIG. 2) of metal members 13 and 14, which will be described below, are to be accommodated is formed in the circuit board 10. The opening 17 is formed in a shape in which a rectangular opening 17A and a rectangular opening 17B are coupled together. The opening 17A and the opening 17B have different sizes according to the sizes of the first head portions 13A and 14A of the metal members 13 and 14.

As shown in FIG. 2, the conductive member 2A includes a busbar 11 and a metal member 13. The conductive member 2B includes a busbar 12 and a metal member 14. The busbars 11 and 12 are made of a copper alloy, and the metal members 13 and 14 are made of pure copper having a purity of 99.9% or more. In the present embodiment, the upper surfaces of the busbars 11 and 12 are referred to as first surfaces, and the lower surface thereof as second surfaces.

Figure 4:
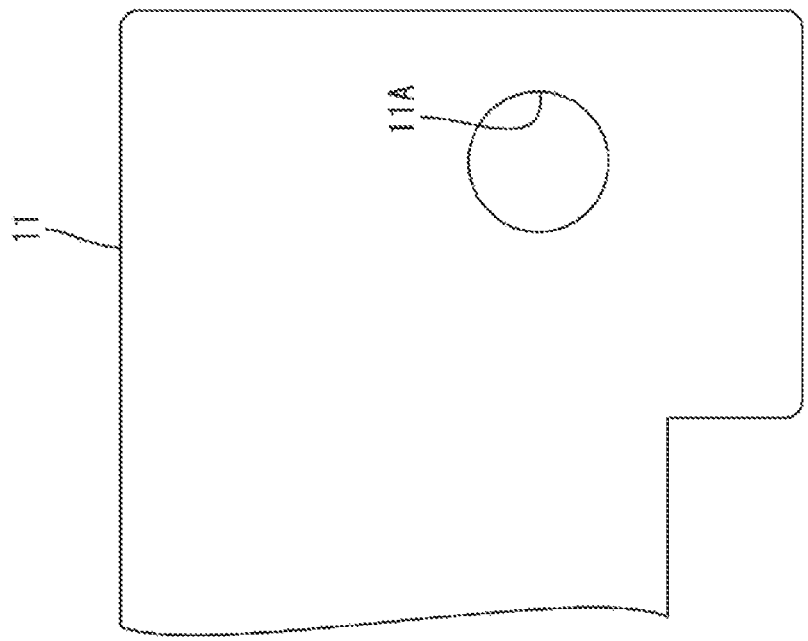
FIG. 4 is a top view of a portion of a busbar.

As shown in FIG. 4, the two busbars 11 and 12 are disposed in different regions of the circuit board 10 with a gap therebetween. The busbars 11 and 12 are each formed by punching a plate material made of a copper alloy into a predetermined shape using a pressing machine, and circular through holes 11A are 12A formed in the busbars 11 and 12, respectively. As shown in FIG. 2, in the surfaces (second surfaces) of the busbars 11 and 12 that face opposite to the circuit board 10, annular countersunk holes 11B and 12B are formed surrounding the through holes 11A and 12A.

Note that a relatively large current for driving a load such as an external vehicle-mounted electric/electronic component or a vehicle motor passes through the busbars 11 and 12, and a relatively small control current for operating a control circuit passes through the circuit board 10.

Next, the metal members 13 and 14 will be described. The configurations of the metal members 13 and 14 are substantially the same, and, therefore, the metal member 13 will be described as an example.

Figure 5:
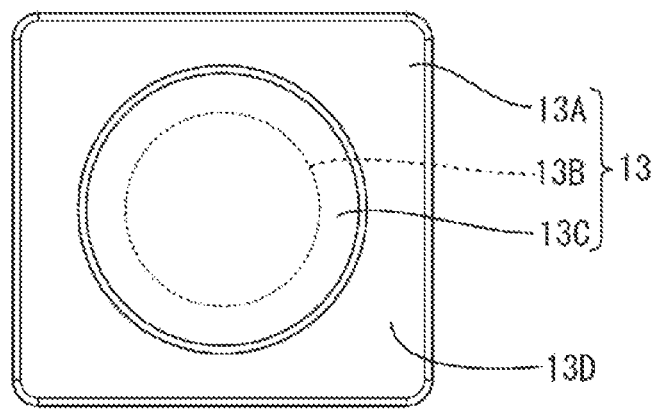
FIG. 5 is a front view of a metal member as viewed from below.

As shown in FIGS. 2 and 5, the metal member 13 includes a substantially square first head portion 13A having a contact surface 13D (FIGS. 2, 5) coming into surface contact with a plate surface of the busbar 11 that faces upward, a columnar shaft portion 13B (FIG. 2) extending substantially perpendicularly from the contact surface 13D of the first head portion 13A, and a disk-shaped second head portion 13C (FIGS. 2, 5) provided at the distal end portion of the shaft portion 13B. In other words, the first head portion 13A is formed at one end portion of the shaft portion 13B, and the second head portion 13C is formed at the other end portion of the shaft portion 13B.

As shown in FIG. 2, the outer diameter of the shaft portion 13B is slightly smaller than the diameter of the through hole 11A of the busbar 11. On the other hand, the outer diameter of the first head portion 13A and the outer diameter of the second head portion 13C are larger than the diameter of the through hole 11A. The thickness (width in the vertical direction) of the second head portion 13C of the metal member 13 substantially matches the depth (width in the vertical direction) of the countersunk hole 11B of the busbar 11.

Although the details will be described below, the second head portion 13C has not been formed on the metal member 13 before being attached to the busbar 11, and the shaft portion 13B on which the second head portion 13C has not been formed is inserted into the through hole 11A and then crimped, thereby forming a second head portion 13C. The metal member 13 before being attached to the busbar 11, i.e., the metal member 13 on which the second head portion 13C has not been formed on the shaft portion 13B, is an example of the rivet.

The electronic component 15, which is constituted by, for example, a semiconductor switching element such as a FET (field effect transistor), is a heat generating component that generates heat according to the current passing therethrough.

Figure 6:
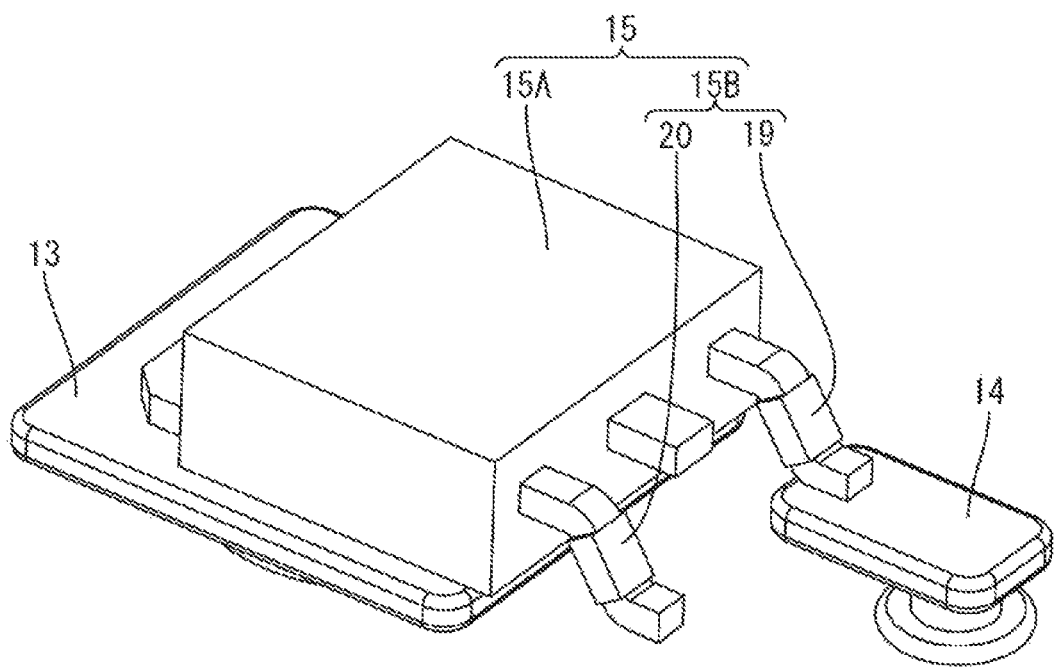
FIG. 6 is a perspective view showing an electronic component and a metal member.

As shown in FIG. 6, the electronic component 15 includes a body 15A including a box-shaped package, and a plurality of terminals 15B. In addition, a pedestal-shaped terminal (not shown) is provided on the lower surface of the body 15A.

The plurality of terminals 15B include a terminal 19 that is connected to the metal member 14 fixed to the busbar 12, and a terminal 20 that is connected to a conductive path (not shown) printed on the circuit board 10. The terminals 19 and 20 and the pedestal-shaped terminal (not shown) are connected to the upper surfaces of the metal members 13 and 14 and the conductive path (not shown) of the circuit board 10 by a known method such as soldering.

The heat sink 16 shown in FIG. 2 is a metal component that absorbs and dissipates heat from the busbars 11 and 12 and the metal members 13 and 14. The upper surface of the heat sink 16 is formed as a flat surface, and is in indirect surface contact with the busbars 11 and 12 and the metal members 13 and 14 via the insulating heat dissipation sheet (not shown).

Manufacturing Process

Next, an example of the manufacturing process of the circuit assembly 1 will be described. First, a metal plate material is subjected to pressing or the like to form busbars 11 and 12. In the present embodiment, through holes 11A and 12A, and countersunk holes 11B and 12B are simultaneously formed in this pressing.

Next, the shaft portions 13B and 14B of the metal members 13 and 14 on which the second head portions 13C and 14C have not been formed (i.e., the rivets) are inserted into the through holes 11A and 12A of the busbars 11 and 12, and the shaft portions 13B and 14B are crimped, thereby forming second head portions 13C and 14C. Consequently, the metal members 13 and 14 are fixed to the busbars 11 and 12. At this time, the lower surfaces (the distal end faces of the second head portion) of the second head portions 13C and 14C of the metal members 13 and 14 are substantially flush with the lower surfaces (second surfaces) of the busbars 11 and 12.

Then, an adhesive is applied to the circuit board 10 or the busbars 11 and 12, and the circuit board 10 and the busbars 11 and 12 are overlapped with and bonded to each other in a state in which the first head portions 13A and 14A of the metal members 13 and 14 are accommodated in the opening 17 of the circuit board 10. At this time, the upper surfaces of the metal members 13 and 14 are substantially flush with the upper surface of the circuit board 10.

Next, the electronic component 15 and so forth are mounted on the upper surface of the circuit board 10, and the plurality of terminals 15B of the electronic component 15 and the pedestal-shaped terminal (not shown) of the electronic component 15 are connected through, for example, reflow soldering, to the metal members 13 and 14 and the conductive path (not shown) of the circuit board 10, thereby forming a circuit assembly 1.

Note that, for example, the shaft portion 13B of the metal member 13 may have the same size as the through hole 11A, and the conductive path (not shown) of the circuit board 10 may be drawn (exposed) in the through hole 11A. Then, the shaft portion 13B may be press-fitted into the through hole 11A, thereby connecting the metal member 13 and the conductive path to each other.

Effects of Embodiment

With the conductive members 2A and 2B described thus far, the metal members 13 and 14 include the first head portions 13A and 14A, and it is thus possible to increase the heat capacities of the metal members 13 and 14 as compared with those achieved with conventional metal members that do not include the first head portions 13A and 14A. Accordingly, it is possible to further increase the heat dissipation of the conductive members 2A and 2B using a simple configuration.

Furthermore, with the conductive members 2A and 2B, the busbars 11 and 12 are made of a copper alloy, and the metal members 13 and 14 are made of pure copper. For example, the thermal conductivity and the electrical conductivity can also be increased by forming the busbars 11 and 12 with pure copper. However, there is concern that the use of pure copper may result in the degradation of leakage characteristics as compared with the use of a copper alloy. With the conductive members 2A and 2B, the busbars 11 and 12 are formed with a copper alloy, whereas the metal members 13 and 14 are formed with pure copper. Accordingly, it is possible to suppress the degradation of leakage characteristics, while increasing the thermal conductivity and the electrical conductivity.

Furthermore, with the conductive members 2A and 2B, the second head portions 13C and 14C having outer diameters larger than the diameters of the through holes 11A and 12A are provided on the sides of the shaft portions 13B and 14B that are opposite to the first head portions 13A and 14A (the other end portions). Accordingly, it is possible to firmly fix the metal members 13 and 14 to the busbars 11 and 12, respectively.

Furthermore, with the conductive members 2A and 2B, the countersunk holes 11B and 12B surrounding the through holes 11A and 12A are provided on the sides of the busbars 11 and 12 that are opposite to the surfaces (second surfaces) with which the first head portions 13A and 14A are in surface contact, and the second head portions 13C and 14C of the metal members 13 and 14 are accommodated in the countersunk holes 11B and 12B. Then, the lower surfaces of the second head portions 13C and 14C are substantially flush with the lower surfaces (second surfaces) of the busbars 11 and 12. Accordingly, the lower surfaces of the second head portions 13C and 14C and the lower surface (second surface) of the busbars 11 and 12 can together be brought into surface contact with the flat surface of the heat sink 16. Consequently, it is possible to further increase the heat dissipation of the conductive members 2A and 2B.

With the circuit assembly 1 according to Embodiment 1, it is possible to further increase the heat dissipation of the circuit assembly 1 using a simple configuration.

Furthermore, with the circuit assembly 1, the electronic component 15 is connected to the metal members 13 and 14, and it is thus possible to dissipate the heat of the electronic component 15 using the metal members 13 and 14.

With the manufacturing method of the conductive members 2A and 2B according to Embodiment 1, it is possible to fix the metal members 13 and 14 to the busbars 11 and 12, while further increasing the heat dissipation of the conductive members 2A and 2B using a simple configuration.

Embodiment 2

Figure 7:
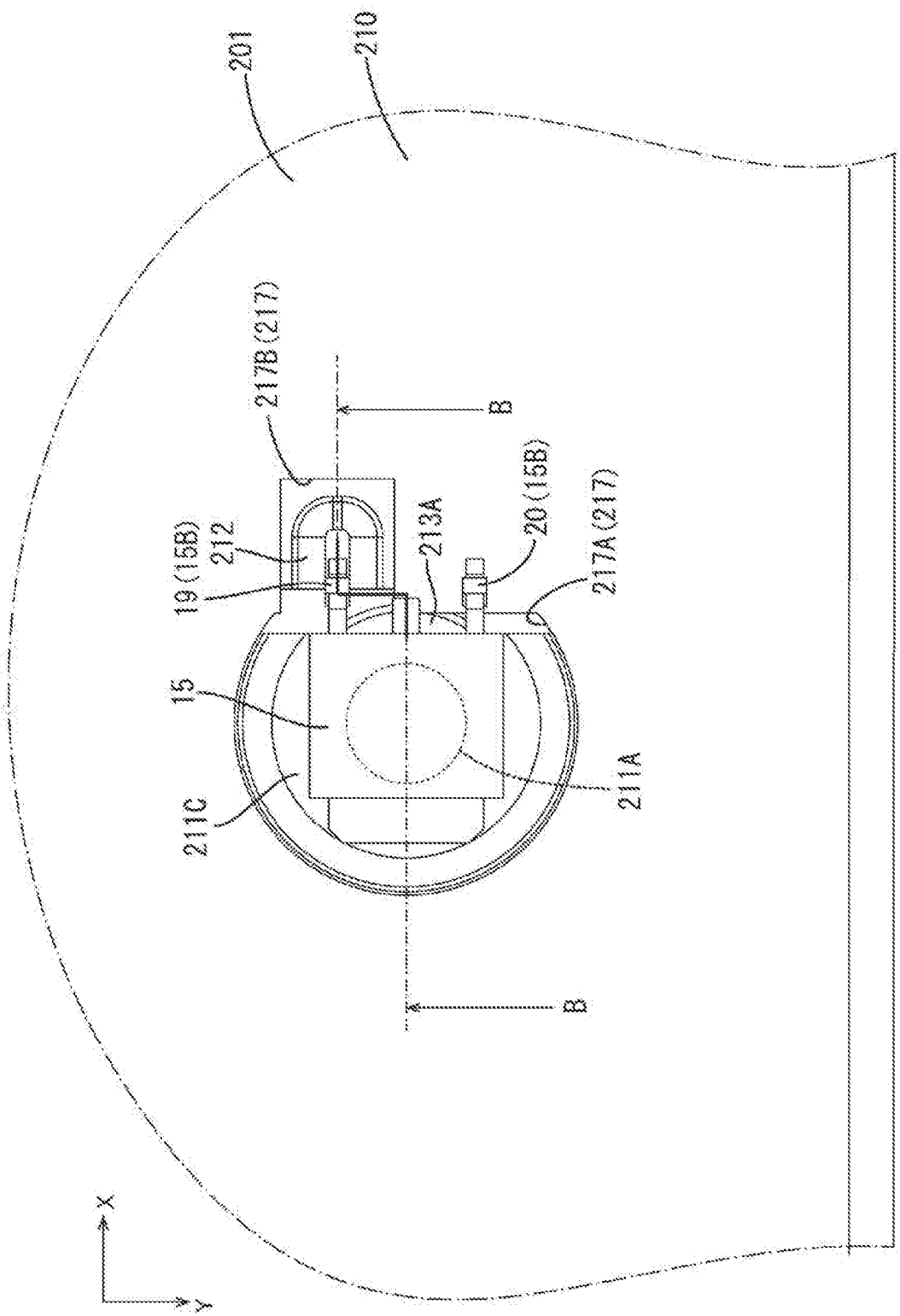
FIG. 7 is a top view of a portion of a circuit assembly according to Embodiment 2.
Figure 8:
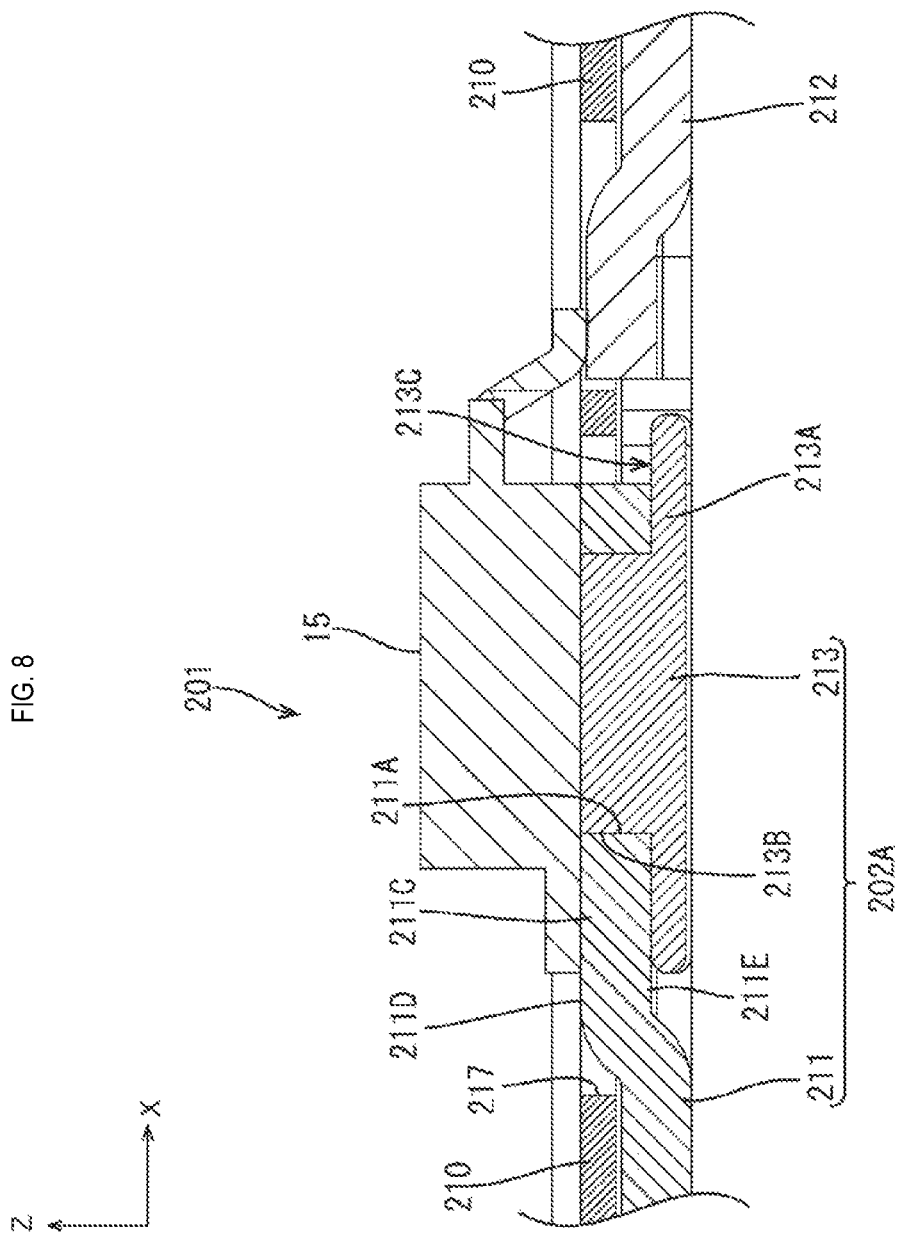
FIG. 8 is a cross-sectional view taken along the line B-B shown in FIG. 7.

Next, Embodiment 2 will be described with reference to FIGS. 7 to 9. As shown in FIGS. 7 and 8, a circuit assembly 201 according to Embodiment 2 includes a circuit board 210 (FIGS. 7, 8), a conductive member 202A (FIG. 8), a busbar 212 (FIG. 8), and an electronic component 15 (FIGS. 7, 8).

As shown in FIG. 7, an opening 217 is formed in the circuit board 210. The opening 217 is formed in a shape in which a rectangular opening 217B is coupled to the right side of an opening 217A having a shape of a circle that is cut away on the right side.

As shown in FIG. 8, the conductive member 202A includes a busbar 211 and a metal member 213. In the present embodiment, the lower surface of the busbar 211 is referred to as a first surface, and the upper surface thereof is referred to as a second surface. At the right end portion of the busbar 211, a stepped portion 211C having an internal space defined by a protrusion 211D formed on the upper surface (second surface) and a recess 211E formed in the lower surface (first surface). Specifically, the stepped portion 211C is formed by pressing the right end portion of the busbar 211, and is formed in a shape of a circle that is cut away on the right side as viewed from above, as shown in FIG. 7. Then, a circular through hole 211A into which a shaft portion 213B of the metal member 213 is to be press-fitted is formed in the stepped portion 211C.

Figure 9:
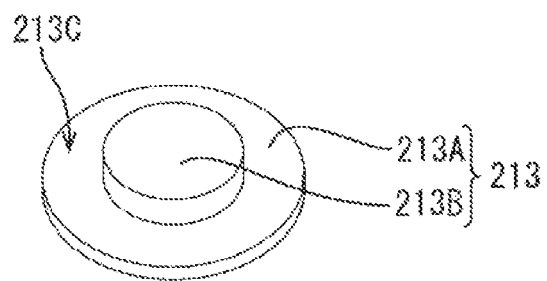
FIG. 9 is a perspective view of a metal member.

As shown in FIG. 9, a first head portion 213A of the metal member 213 according to Embodiment 2 is disk-shaped, and a surface 213C thereof that faces upward is a contact surface coming into surface contact with the plate surface of the busbar 211. Then, a columnar shaft portion 213B extends upward from the contact surface 213C. Note that the metal member 213 according to Embodiment 2 does not include a portion corresponding to the second head portion 13C according to Embodiment 1.

As shown in FIG. 8, the metal member 213 is fixed to the busbar 211 as a result of the shaft portion 213B being press-fitted from below into the through hole 211A of the busbar 211. In a state in which the shaft portion 213B is press-fitted in the through hole 211A, the first head portion 213A is in the state of being accommodated in the recess 211E (i.e., the internal space of the stepped portion 211C), and the lower surface of the first head portion 213A and the lower surface of the busbar 211 are substantially flush with each other.

Although the busbar 212 corresponds to the busbar 12 according to Embodiment 1, no metal member is attached to the busbar 212, and the left end portion of the busbar 212 is bent upward through pressing or the like.

The busbar 211 is overlapped with the circuit board 210 in a state in which the protrusion 211D is accommodated in the opening 217 of the circuit board 210. In a state in which the busbar 211 is overlapped with the circuit board 210, the upper surface of the metal member 213, the upper surface of the protrusion 211D, the upper surface of the left end portion of the busbar 212, and the upper surface of the circuit board 210 are substantially flush with each other. Then, a pedestal-shaped terminal (not shown) of the electronic component 15 is connected to the upper surface of the shaft portion 213B that is press-fitted in the busbar 211, and to the upper surface of the protrusion 211D.

With the conductive member 202A according to Embodiment 2 described thus far, the lower surface (the distal end face of the first head portion 213A) of the first head portion 213A of the metal member 213 and the lower surface (first surface) of the busbar 211 can be made substantially flush with each other. Accordingly, the lower surface of the first head portion 213A and the lower surface (first surface) of the busbar 211 can together be brought into surface contact with the flat surface of the heat sink 16. By doing so, the contact area between the heat sink 16 and the metal member 213 can be increased as compared with a case where the distal end face of the shaft portion 213B is brought into surface contact with the heat sink 16, thus making it possible to further increase the heat dissipation of the conductive member 202A.

Furthermore, with the circuit assembly 201 according to Embodiment 2, it is possible to further increase the heat dissipation of the circuit assembly 201 using a simple configuration.

Furthermore, with the manufacturing method of the conductive member 202A according to Embodiment 2, it is possible to fix the metal member 213 to the busbar 211, while further increasing the heat dissipation of the conductive member 202A using a simple configuration.

Other Embodiments

The technique disclosed in the present specification is not limited to the above described and illustrated embodiments. For example, the following embodiments are also included in the technical scope disclosed in the present specification.

In the above embodiments, an exemplary case is described in which the busbar is made of a copper alloy, and the metal member is made of pure copper; however, the busbar may be made of pure copper, and the metal member may be made of a copper alloy. Alternatively, both the busbar and the metal member may be made of pure copper, or both the busbar and the metal member may be made of a copper alloy. In that case as well, the heat capacity is increased by the provision of the first head portion, and the heat dissipation is thus increased as compared with that achieved by conventional techniques.

Note that, when the busbar is made of pure copper, it is possible to reduce the thickness of the busbar, and to partially increase the thickness of the busbar using a rivet.

In the above embodiments, an exemplary case is described in which the busbar and the metal member are made of a copper alloy or pure copper; however, they may be made of a metal other than copper.

In Embodiment 1 above, an exemplary case is described in which the metal member is crimped to the busbar. In Embodiment 2 above, an exemplary case is described in which the metal member is press-fitted into the busbar. In contrast, the shaft portion of the metal member may be inserted into the through hole of the busbar, and, in that state, the shaft portion and the busbar may be fixed to each other through soldering.

In the above embodiments, a FET is described as an example of the electronic component; however, the electronic component is not limited to FETs.

The invention claimed is:

1. A conductive member comprising:
   a busbar having a through hole; and
   a metal member fixed to the busbar,
   wherein the metal member includes a shaft portion passed through the through hole, and a first head portion at one end portion of the shaft portion, the first head portion having an outer diameter larger than a diameter of the through hole, and wherein the busbar is formed of a copper alloy, and the metal member is formed of pure copper.

2. The conductive member according to claim 1, wherein a second head portion having an outer diameter larger than the diameter of the through hole is provided at another end portion of the shaft portion.

3. The conductive member according to claim 2,
   wherein the busbar has a first surface coming into contact with the first head portion, and a second surface located opposite to the first surface, and a countersunk hole having a diameter larger than the diameter of the through hole is provided in the second surface of the busbar around an edge portion of the through hole, and the second head portion is accommodated in the countersunk hole.

4. A circuit assembly comprising:
the conductive member according to claim 1; and
a circuit board having an opening in which the first head portion is to be accommodated,
wherein the busbar is overlapped with and bonded to the circuit board in a state in which the first head portion is accommodated in the opening.

5. The circuit assembly according to claim 4,
wherein a terminal of an electronic component is connected to the metal member.

6. The conductive member according to claim 2, wherein the busbar has a first surface coming into contact with the first head portion, and a second surface located opposite to the first surface, and
a protrusion formed on the first surface and a recess formed in the second surface at a position corresponding to the protrusion form a stepped portion on the busbar, and the first head portion is accommodated in the recess.

7. A circuit assembly comprising:
the conductive member according to claim 2; and
a circuit board having an opening in which the first head portion is to be accommodated,
wherein the busbar is overlapped with and bonded to the circuit board in a state in which the first head portion is accommodated in the opening.

8. A circuit assembly comprising:
the conductive member according to claim 3; and
a circuit board having an opening in which the first head portion is to be accommodated,
wherein the busbar is overlapped with and bonded to the circuit board in a state in which the first head portion is accommodated in the opening.

9. A conductive member comprising:
a busbar having a through hole; and
a metal member fixed to the busbar,
wherein the metal member includes a shaft portion passed through the through hole, and a first head portion at one end portion of the shaft portion, the first head portion having an outer diameter larger than a diameter of the through hole; and
wherein the busbar has a first surface coming into contact with the first head portion, and a second surface located opposite to the first surface, and
a protrusion formed on the first surface and a recess formed in the second surface at a position corresponding to the protrusion form a stepped portion on the busbar, and the first head portion is accommodated in the recess.

10. A circuit assembly comprising:
the conductive member according to claim 9; and
a circuit board having an opening in which the protrusion is to be accommodated,
wherein the busbar is overlapped with and bonded to the circuit board in a state in which the protrusion is accommodated in the opening.

11. The circuit assembly according to claim 10, wherein a terminal of an electronic component is connected to the metal member.

* * * * *